(12) United States Patent
Arai et al.

(10) Patent No.: US 8,097,920 B2
(45) Date of Patent: Jan. 17, 2012

(54) SEMICONDUCTOR INTEGRATED CIRCUIT COMPRISING ELECTRO STATIC DISCHARGE PROTECTION ELEMENT

(75) Inventors: Katsuya Arai, Kyoto (JP); Toshihiro Kogami, Kyoto (JP); Hiroaki Yabu, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/117,838

(22) Filed: May 27, 2011

(65) Prior Publication Data

US 2011/0227197 A1    Sep. 22, 2011

Related U.S. Application Data

(63) Continuation of application No. 11/808,445, filed on Jun. 11, 2007, now abandoned.

(30) Foreign Application Priority Data

Oct. 3, 2006   (JP) .................................. 2006-271810

(51) Int. Cl.
 *H01L 23/62*   (2006.01)
 *H01L 29/72*   (2006.01)
(52) U.S. Cl. ........................................ 257/355; 257/173

(58) Field of Classification Search .................. 257/173, 257/355–363, E29.026, E29.335
See application file for complete search history.

(56) References Cited

U.S. PATENT DOCUMENTS

| | | | |
|---|---|---|---|
| 6,444,511 B1 | 9/2002 | Wu et al. | |
| 6,590,264 B2 | 7/2003 | Ker et al. | |
| 7,034,363 B2 * | 4/2006 | Chen | 257/355 |
| 7,274,071 B2 * | 9/2007 | Ando et al. | 257/355 |
| 7,309,896 B2 * | 12/2007 | Kim | 257/355 |
| 2004/0155291 A1 | 8/2004 | Okushima | |
| 2005/0067657 A1 | 3/2005 | Tanaka | |

FOREIGN PATENT DOCUMENTS

| | | |
|---|---|---|
| EP | 0 345 432 A1 | 12/1989 |
| JP | 2-58262 | 2/1990 |

* cited by examiner

*Primary Examiner* — Hung Vu
(74) *Attorney, Agent, or Firm* — McDermott Will & Emery LLP

(57) ABSTRACT

An electro static discharge protection element being formed by a diode including a well region of a first conductivity type on a surface of a semiconductor substrate, and a first diffusion layer of a second conductivity type in the well region. The first diffusion layer is surrounded by a second diffusion layer of the first conductivity type in the well region. The first diffusion layer has a surface on which a first contact region connected to an input/output terminal is formed. The first diffusion layer has a surface on which a second contact region connected to a reference voltage terminal is formed.

12 Claims, 6 Drawing Sheets

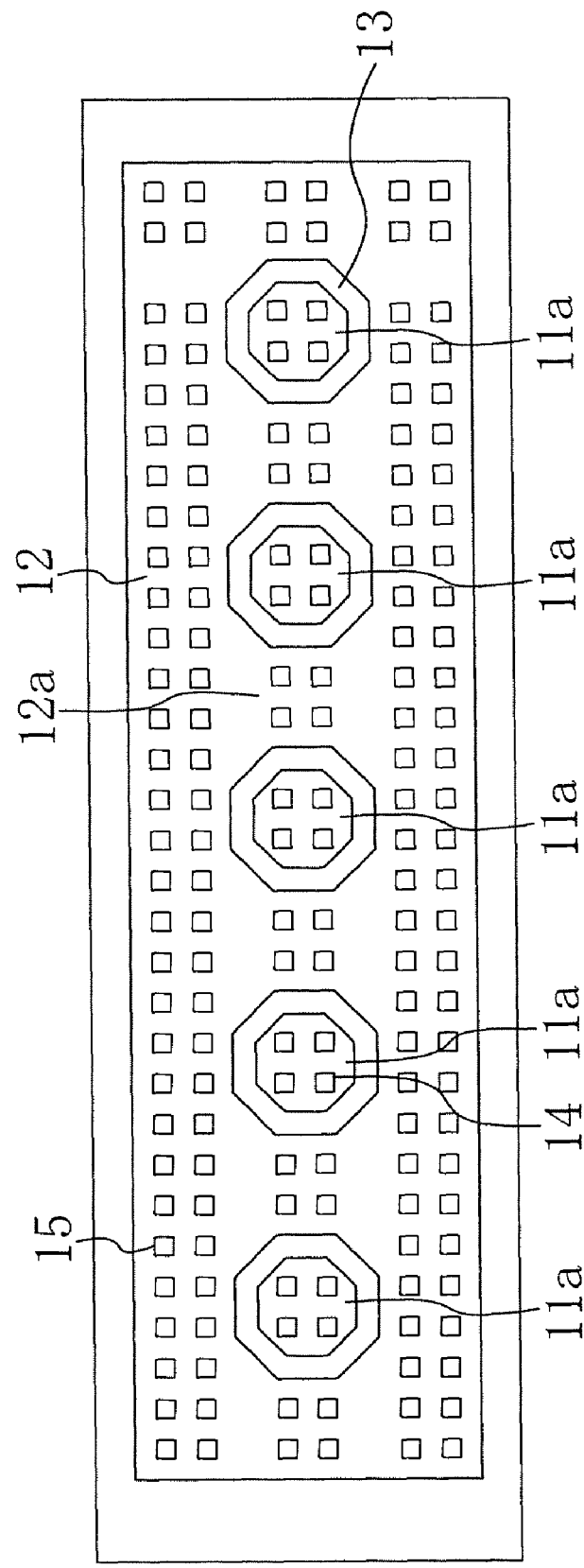

SEMICONDUCTOR INTEGRATED CIRCUIT COMPRISING ELECTRO STATIC DISCHARGE PROTECTION ELEMENT

RELATED APPLICATIONS

This application is a Continuation of U.S. application Ser. No. 11/808,445, filed on Jun. 11, 2007, now abandoned claiming priority of Japanese Patent Application No. 2006-271810, filed on Oct. 3, 2006, the entire contents of each of which are hereby incorporated by reference.

BACKGROUND OF THE INVENTION

1. Field of the Invention

The present invention relates to a semiconductor integrated circuit device including an electro static discharge (ESD) protection element.

2. Description of the Prior Art

As the integration degree of a semiconductor integrated circuit device increases along with the miniaturization and increase in density of elements, the semiconductor integrated circuit device becomes more susceptible to damages due to electro static discharge (hereinafter referred to as "surge"). For example, the surge intruding via a pad for external connection destructs elements, such as an input circuit, an output circuit, an input/output circuit, and an internal circuit, which increases the possibility of reduced performance of elements. To cope with the problem, the semiconductor integrated circuit device includes an electro static discharge (ESD) protection element for protection against the surge. The ESD protection element is provided between the pad for external connection and the input circuit, the output circuit, the input/output circuit, or the internal circuit.

FIG. 8A and FIG. 8B show a configuration of a conventional ESD protection element, wherein FIG. 8A is a plan view, and FIG. 8B is a cross section taken along the line VIIIb-VIIIb of FIG. 8A (see, for example, Japanese Laid-Open Patent Publication No. 2-58262).

In a well region 110 formed in a semiconductor substrate, a diffusion layer 111 and a diffusion layer 112 are formed. The diffusion layer 111 has a conductivity type opposite to that of the well region 110. The diffusion layer 112 has the same conductivity type as that of the well region 110. The diffusion layer 111 and the diffusion layer 112 are arranged facing each other with a dielectric isolation region 113 interposed therebetween. On the diffusion layers 111 and 112, a plurality of contact regions 114 and 115 are respectively formed. The diffusion layers 111 and 112 are respectively connected to electrodes 122 via plugs 121 formed in an interlayer dielectric film 120. The electrode 122 connected to the diffusion layer 111 is connected to a pad 123 for external connection. The electrode 122 connected to the diffusion layer 112 is connected to a power source or a ground.

Upon intrusion of a surge via the pad 123 for external connection, a diode formed by the well region 110 and the diffusion layer 111 is brought into conduction. As a result, the externally intruding surge is led to the power source or the ground connected to the diffusion layer 112, making it possible to protect a circuit which is to be protected.

SUMMARY OF THE INVENTION

Along with the enhanced speed and multifunctionalization in personal computers, routers, and peripheral electronics devices in recent years, a high-speed interface having a transfer speed of an order of 1 GHz has been required. However, if a protection element is formed for the high-speed interface, the protection element may influence a waveform of transfer data. That is, when a signal is input to the high-speed interface, a displacement current is induced by the protection element. In this case, the magnitude of the displacement current is proportional to the product of capacitance of the protection element and the frequency of the input signal. Therefore, if the frequency of the input signal increases, the influence on the waveform of the transfer data is no longer negligible.

To suppress the influence, it is necessary to reduce the capacitance of the protection element, and to reduce the capacitance of the protection element, it is necessary to reduce the area of the diffusion layer 111 of the conventional protection diode of FIG. 8. However, if the area of the diffusion layer 111 is reduced, ability to discharge the surge is reduced, so that the primary function of protecting an element to be protected can no longer be carried out. That is, there is a trade-off relationship between reduced input capacitance and high resistance to ESD. Therefore, it is not possible to realize an ESD element which is adapted to a high-speed interface and which has both characteristics of the reduced input capacitance and the high resistance to ESD.

In view of the above-mentioned problems, a main object of the present invention is to provide a semiconductor integrated circuit device which has a simple structure and which includes an electro static discharge protection element having reduced input capacitance and high resistance to ESD.

To achieve the above-mentioned object, an electro static discharge protection element of the present invention has such a configuration that a diffusion layer which constitutes a diode and which is formed in a well region is surrounded by a diffusion layer. The latter diffusion layer having a conductivity type opposite to that of the former diffusion layer (the latter diffusion layer has the same conductivity type as that of the well region). That is, a semiconductor integrated circuit device of the present invention includes an electro static discharge protection element, the electro static discharge protection element being formed by a diode including: a well region of a first conductivity type in a semiconductor substrate; and a first diffusion layer of a second conductivity type in the well region, wherein the first diffusion layer is surrounded by a second diffusion layer of the first conductivity type in the well region, the first diffusion layer has a surface on which a first contact region connected to an input/output terminal is formed, and the second diffusion layer has a surface on which a second contact region connected to a reference voltage terminal is formed.

According to such configuration, it is possible to increase the length along which the first diffusion layer and the second diffusion layer face each other. Therefore, even in a case where a junction area of the first diffusion layer and the well region which constitute a diode is reduced, it is possible to discharge a surge current intruding into the input/output terminal to the second diffusion layer surrounding the first diffusion layer. As a result, it is possible to realize a semiconductor integrated circuit device including an electro static discharge protection element having reduced input capacitance and high resistance to ESD.

Moreover, since the surge current is absorbed by the second diffusion layer surrounding the first diffusion layer, it is possible to prevent the latch-up which occurs between the electro static discharge protection element and a CMOS circuit which is arranged in circumference of the electro static discharge protection element.

In a preferable embodiment, a dielectric isolation region is formed between the first diffusion layer and the second diffusion layer. According to the configuration, even in a case where the second diffusion layer is formed to surround the first diffusion layer, no PN junction is formed between the first diffusion layer and the second diffusion layer. Therefore, it is possible to suppress an increase in input capacitance of the electro static diffusion protection element.

In a preferable embodiment, the first diffusion layer is rectangular in shape, and the second contact region is formed only in a portion facing a long side of the first diffusion layer. Moreover, it is preferable that the second contact region has end portions arranged in a position in alignment with end portions of the first contact region formed along a longitudinal direction of the first diffusion layer. According to the configuration, it is possible to prevent concentration of the surge current on the end portions of the first contact region. Therefore, it is possible to realize a highly reliable electro static discharge protection element having reduced input capacitance and high resistance to ESD.

In a preferable embodiment, the first diffusion layer is rectangular in shape, and the first contact region formed along a longitudinal direction of the first diffusion layer has end portions which are greater in area than the other portions of the first contact region. According to the configuration, it is possible to prevent concentration of the surge current on the end portions of the first contact region. Therefore, it is possible to realize a highly reliable electro static discharge protection element having reduced input capacitance and high resistance to ESD.

In a preferable embodiment, the first diffusion layer is rectangular in shape, and a width of the second diffusion layer facing a short side of the first diffusion layer is narrower than a width of the second diffusion layer facing a long side of the first diffusion layer. According to the configuration, it is possible to shorten a path of the surge current in the second diffusion layer. Therefore, it is possible to realize a highly reliable electro static discharge protection element having reduced input capacitance and high resistance to ESD.

In a preferable embodiment, the first diffusion layer is rectangular in shape, and a distance between the first diffusion layer and the second diffusion layer along a long side of the first diffusion layer is narrower than a distance between the first diffusion layer and the second diffusion layer along a short side of the first diffusion layer. According to the configuration, it is possible to shorten a path of the surge current in the second diffusion layer. Therefore, it is possible to realize a highly reliable electro static discharge protection element having reduced input capacitance and high resistance to ESD.

In a preferable embodiment, the first diffusion layer is formed into a plurality of divided diffusion regions, and the second diffusion layer is formed also between the divided diffusion regions. Moreover, it is preferable that the divided diffusion regions are arranged at a regular interval. According to the configuration, it is possible to increase a length along which the first diffusion layer and the second diffusion layer face each other. Therefore, it is possible to realize an electro static discharge protection element which has further improved resistance to ESD and reduced input capacitance.

According to the semiconductor integrated circuit device of the present invention, a length along which the first diffusion layer and the second diffusion layer face each other is increased, which makes it possible to realize a semiconductor integrated circuit device including an electro static discharge protection element having reduced input capacitance and high resistance to ESD.

BRIEF DESCRIPTION OF THE DRAWINGS

FIG. 7 is a plan view illustrating a configuration of an electro static discharge protection element according to a variation of Embodiment 6 of the present invention.

DESCRIPTION OF THE PREFERRED EMBODIMENTS

Figure 1A:
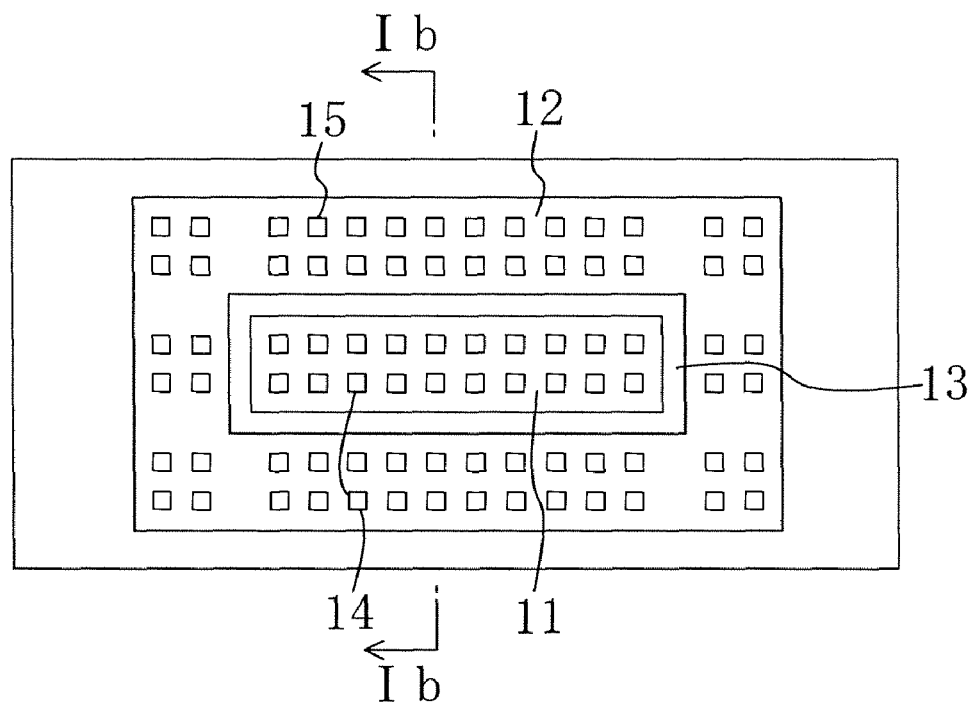
FIG. 1A is a plan view illustrating a configuration of an electrostatic discharge protection element of a semiconductor integrated circuit device of Embodiment 1 of the present invention.

Embodiments of the present invention will be described below with reference to the drawings. In the following drawings, components having substantially the same function are indicated by the same reference numerals for easy explanation. Note that, the present invention is not limited to the embodiments below.

Embodiment 1

Figure 1B:
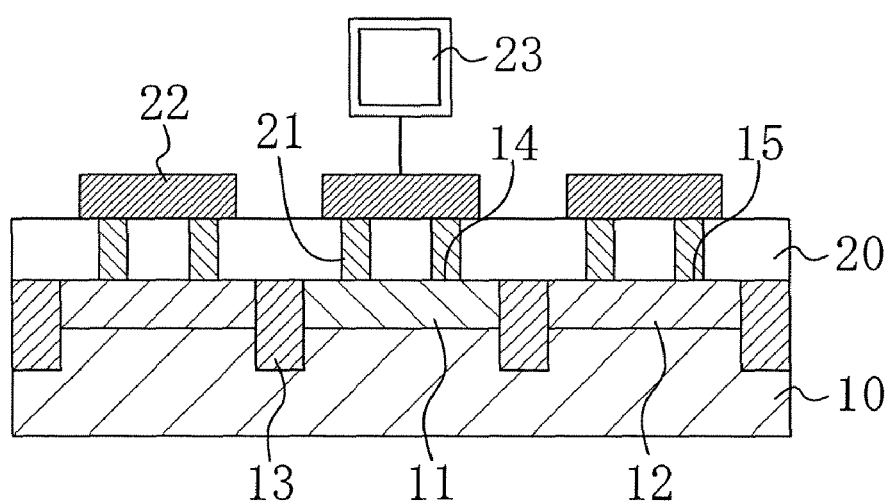
FIG. 1B is a cross section taken along the line Ib-Ib of FIG. 1A.

FIG. 1A and FIG. 1B are views illustrating a configuration of an electro static discharge protection element of a semiconductor integrated circuit device of Embodiment 1 of the present invention, wherein FIG. 1A is a plan view, and FIG. 1B is a cross section taken along the line Ib-Ib of FIG. 1A.

As shown in FIG. 1A and FIG. 1B, on a surface of a semiconductor substrate (not shown), an n-type well region 10 is formed which has, for example, ions of n-type impurity implanted with a dose of $1E13$ $cm^{-2}$. Further, in the well region 10, a p-type first diffusion layer 11 is formed which has, for example, ions of p-type impurity implanted with a dose of $1E15$ $cm^{-2}$. The well region 10 and the first diffusion layer 11 constitute a diode, which is a protection element.

Moreover, a second diffusion layer 12 which is n type (the same conductivity type as that of the well region 10) is formed in the well region 10 so as to surround the first diffusion layer 11, the second diffusion layer 12 having, for example, ions of an n-type impurity implanted with a dose of $1E15$ $cm^{-2}$. Between the first diffusion layer 11 and the second diffusion layer 12, a dielectric isolation region 13 formed by, for example, an oxide film is formed. Here, it is preferable that the dielectric isolation region 13 is deeper than the first diffusion layer 11 and the second diffusion layer 12.

Furthermore, the first diffusion layer 11 has a surface on which first contact regions 14 are formed. The first contact regions 14 are connected to an input/output terminal (pad for external connection) 23 via contact plugs 21 formed in an interlayer dielectric film 20. Likewise, the second diffusion layer 12 has a surface on which contact regions 15 are formed. The second contact regions 15 are connected to a reference voltage terminal (for example, a power source terminal or a ground terminal) via contact plugs 21 formed in the interlayer dielectric film 20. Here, the first contact regions 14 and the second contact regions 15 are respectively formed into a plurality of divided contact regions. However, one continuing contact region which is not divided may be formed. Alternatively, one contact region for each side of the first diffusion layer 11 may be formed in the second diffusion layer 12.

As described above, the second diffusion layer 12 are formed so as to surround the first diffusion layer 11 constituting the diode, which makes it possible to increase the length along which the first diffusion layer 11 and the second diffusion layer 12 face each other. Therefore, even in a case where a joint area of the first diffusion layer 11 and the well region 10 is reduced, it is possible to discharge a surge current intruding into the input/output terminal 23 to the second diffusion layer 12 surrounding the first diffusion layer 11. Therefore, even in a case where input capacitance of the protection element is reduced, ability to discharge the surge is not reduced. That is, adopting the configuration of the protection film as shown in FIG. 1A and FIG. 1B makes it possible to realize an ESD protection element which has both characteristics of the reduced input capacitance and the high resistance to ESD.

As an example, in the configuration of the protection element shown in FIG. 1A and FIG. 1B, it is assumed that the n-type well region 10 has phosphor (P) with a dose of 1.08E13 $cm^{-2}$, the p-type first diffusion layer 11 has boron (B) with a dose of 4.4E15 $cm^{-2}$ and has a surface area of $0.6 \times 50$ $\mu m^2$, and the n-type second diffusion layer 12 has arsenic (As) with a dose of 4.4E15 $cm^{-2}$ and has a surface area of $1.2 \times 50$ $\mu m^2$. In this case, the protection element has an input capacitance of about 0.1 pF. Moreover, even in a case where a surge which has a positive charge of 2000 V is applied to the first diffusion layer 11, the protection element is not destructed, and the surge current is discharged to the ground terminal via the second diffusion layer 12.

Also from the example mentioned above, it can be concluded that the protection element of Embodiment 1 has sufficient performance with regard to the reduced input capacitance and the high resistance to the surge to be applicable to a protection element for the high-speed interface.

Moreover, since the surge current is absorbed by the second diffusion layer 12 surrounding the first diffusion layer 11, it is possible to suppress the transmission of the surge current to the CMOS transistor constituting the semiconductor integrated circuit device. This makes it possible to effectively prevent the latch-up of the CMOS transistor.

In Embodiment 1, the second diffusion layer 12 is formed so as to surround the first diffusion layer 11. However, it is possible to realize the effects of the present invention of protecting the element to be protected from the surge and preventing the latch-up even in a case where the first diffusion layer 11 is not completely surrounded by the second diffusion layer 12.

Embodiment 2

Figure 2:
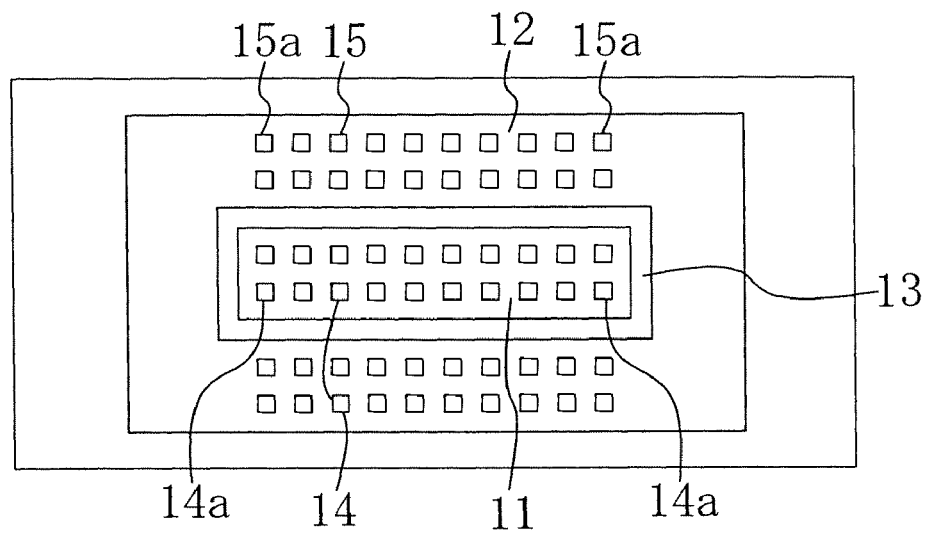
FIG. 2 is a plan view illustrating a configuration of an electrostatic discharge protection element of a semiconductor integrated circuit device of Embodiment 2 of the present invention.

FIG. 2 is a plan view illustrating a configuration of an electro static discharge protection element of a semiconductor integrated circuit device of Embodiment 2 of the present invention. The protection element in FIG. 2 is different from the protection element of FIG. 1A and FIG. 1B only in position of the contact regions 14 and 15. The first diffusion layer 11 and the second diffusion layer 12 in FIG. 2 have the same configuration as that of FIG. 1A and FIG. 1B.

When the contact regions 14 and 15 are arranged as in FIG. 1A, a surge intruding via the input/output terminal 23 may concentrate on a part of contact regions situated at both ends of a sequence of the contact regions 14 formed in the first diffusion layer 11, which may destruct the part of the contact regions. As a result, the resistance of the protection element to the surge is reduced, which may reduce reliability.

To prevent such concentration of the surge current, a protection element of Embodiment 2 has such a configuration that the second contact regions 15 are formed only in portions facing the long sides of the first diffusion layer 11 as shown in FIG. 2. According to the configuration, the surge current intruding into the first diffusion layer 11 flows to the contact regions 15 in two directions, the contact regions 15 being formed in portions of the second diffusion layer 12 facing the long sides of the first diffusion layer 11. Then, the surge current is discharged to a power supply terminal or to a ground. Therefore, it is possible to prevent the concentration of the surge current on the first contact regions situated at the both ends of a sequence of the first contact regions 14. Therefore, it is possible to realize a highly reliable electro static discharge protection element having reduced input capacitance and high resistance to ESD.

In order to effectively prevent the concentration of the surge current, it is preferable that second contact regions 15a situated at both ends of a sequence of the second contact regions 15 are arranged in alignment with first contact regions 14a situated at both ends of a sequence of the first contact regions 14 formed along a longitudinal direction of the first diffusion layer 11 as shown in FIG. 2. Moreover, the first contact regions 14 and the second contact regions 15 are formed into a plurality of divided contact regions. However, instead of the divided contact regions, one continuing contact region may be formed.

Embodiment 3

Figure 3:
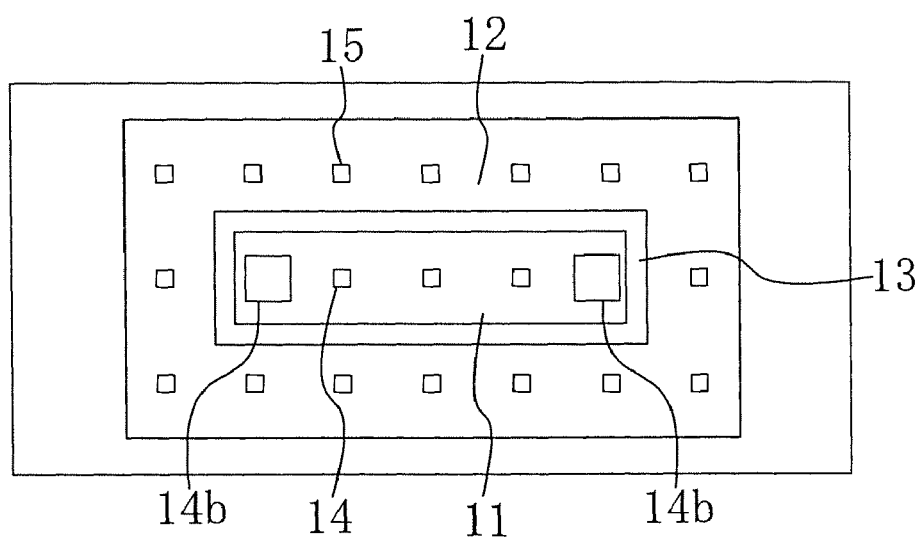
FIG. 3 is a plan view illustrating a configuration of an electrostatic discharge protection element of a semiconductor integrated circuit device of Embodiment 3 of the present invention.

FIG. 3 is a plan view illustrating a configuration of an electro static discharge protection element of a semiconductor integrated circuit device of Embodiment 3 of the present invention. The protection element in FIG. 3 is different from the protection element of FIG. 1A and FIG. 1B only in position of the contact regions 14 and 15. The first diffusion layer 11 and the second diffusion layer 12 in FIG. 3 have the same configuration as that of FIG. 1A and FIG. 1B.

In the protection element of Embodiment 3, reduction in resistance to the surge is prevented even in a case where a surge current concentrates on first contact regions situated at both ends of a sequence of the first contact regions 14. The protection element of Embodiment 3 has such a configuration that first contact regions 14b situated at both ends of a sequence of the first contact regions 14 formed along a longitudinal direction of the first diffusion layer 11 are greater in area than each of the first contact regions 14 as shown in FIG. 3. According to the configuration, even in a case where the surge current concentrates on the first contact regions 14b on the both ends of the sequence of the first contact regions 14, it is possible to prevent the destruction of the contact region, because the first contact regions 14b are greater in area than the first contact regions 14. Therefore, it is possible to realize a highly reliable electro static discharge protection element having the reduced input capacitance and high resistance to ESD.

In a case where the first contact regions 14 are formed into a plurality of divided contact regions as shown in FIG. 3, the first contact regions 14b on end portions of the first diffusion layer 11 are formed to have a greater area than that of the contact regions 14 which are formed into divided contact regions. Moreover, in a case where one continuing contact region is formed instead of divided contact regions, both end portions of the contact region are formed to have a greater area than that of the other portions of the contact region. Moreover, instead of increasing the area, the number of contact regions on the end portions of the first diffusion layer 11 may be increased, the contact regions having the same size.

Embodiment 4

Figure 4:
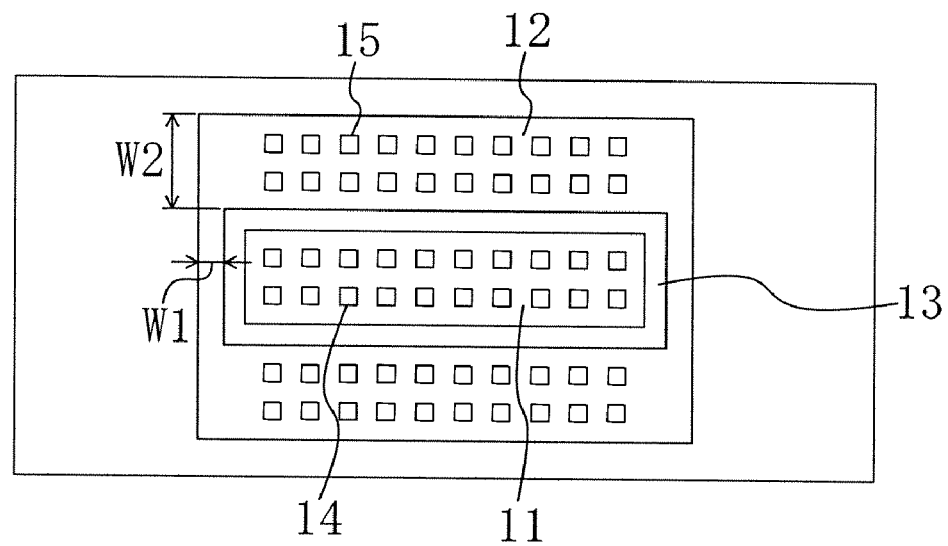
FIG. 4 is a plan view illustrating a configuration of an electrostatic discharge protection element of a semiconductor integrated circuit device of Embodiment 4 of the present invention.

FIG. 4 is a plan view illustrating a configuration of an electro static discharge protection element of a semiconductor integrated circuit device of Embodiment 4 of the present invention. The electro static discharge protection element in FIG. 4 is different from the electro static discharge protection element of FIG. 1A and FIG. 1B only in shape of the second diffusion layer 12. Other components in FIG. 4 have the same configuration as that of FIG. 1A and FIG. 1B.

As shown in FIG. 2, forming the second contact regions 15 only in portions facing the long sides of the first diffusion layer 11 makes it possible to prevent the concentration of a surge current on both ends of a sequence of the first contact regions 14. However, in a salicide process, a part of the surge current intruding into the first diffusion layer 11 flows to the contact regions 15 via the second diffusion layer 12 facing the short sides of the first diffusion layer 11 due to a low resistance of the diffusion layer. Therefore, the surge current may concentrate on the both ends of a sequence of the first contact regions 14.

A protection element of Embodiment 4 prevents the concentration of the surge current on the both ends of a sequence of the first contact regions 14. The protection element of Embodiment 4 has such a configuration that the width W1 of the second diffusion layer 12 facing the short sides of the first diffusion layer 11 is formed to be narrower than the width W2 of the second diffusion layer 12 facing the long sides of the first diffusion layer 11 as shown in FIG. 4. According to the configuration, it is possible to reduce the surge current which flows to the contact regions 15 via the second diffusion layer 12 facing the short sides of the first diffusion layer 11 and to prevent the concentration of the surge current on the both ends of a sequence of the first contact regions 14.

Embodiment 5

Figure 5:
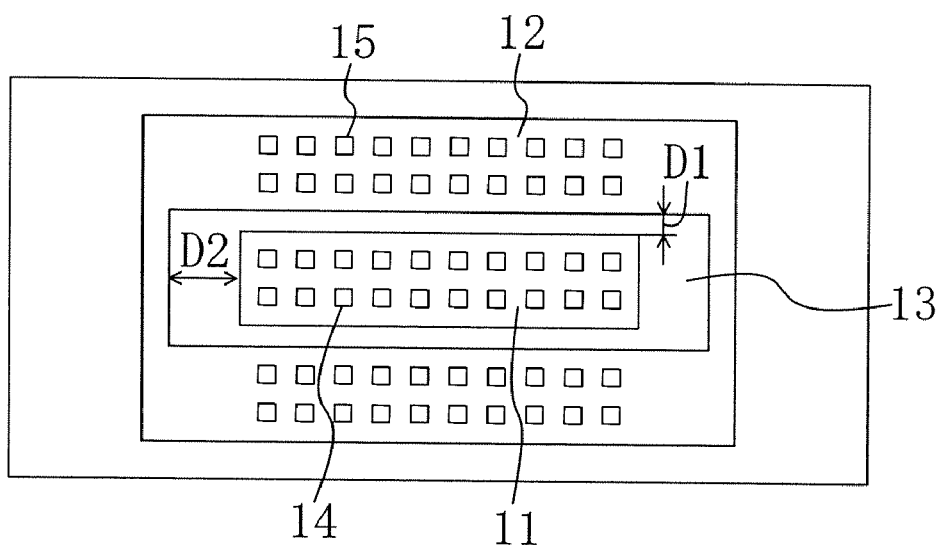
FIG. 5 is a plan view illustrating a configuration of an electrostatic discharge protection element of a semiconductor integrated circuit device of Embodiment 5 of the present invention.

FIG. 5 is a plan view illustrating a configuration of an electro static discharge protection element of a semiconductor integrated circuit device of Embodiment 5 of the present invention. The electro static discharge protection element in FIG. 5 is different from the electro static discharge protection element of FIG. 4 only in shape of the dielectric isolation region 13. Other components in FIG. 5 have the same configuration as that of FIG. 4.

According to the configuration as shown in FIG. 4, the width W1 of the second diffusion layer 12 facing the short sides of the first diffusion layer 11 is formed to be narrower than the width W2 of the second diffusion layer 12 facing the long sides of the first diffusion layer 11, which shortens a path of the surge current in the second diffusion layer. Therefore, it is possible to prevent the concentration of the surge current on the both ends of the first contact regions 14. However, it is not possible to completely prevent that a part of the surge current flows to the second diffusion layer 12 facing the short sides of the first diffusion layer 11.

In order to further reduce the surge current flowing to the second diffusion layer 12 facing the short sides of the first diffusion layer 11, a protection element of Embodiment 5 has such a configuration that the distance D1 between the first diffusion layer 11 and the second diffusion layer 12 along the long sides of the first diffusion layer 11 is formed to be narrower than the distance D2 between the first diffusion layer 11 and the second diffusion layer 12 along the short sides of the first diffusion layer 11. According to the configuration, it is possible to further reduce the surge current flowing to the second diffusion layer 12 facing the short sides of the first diffusion layer 11.

Embodiment 6

Figure 6:
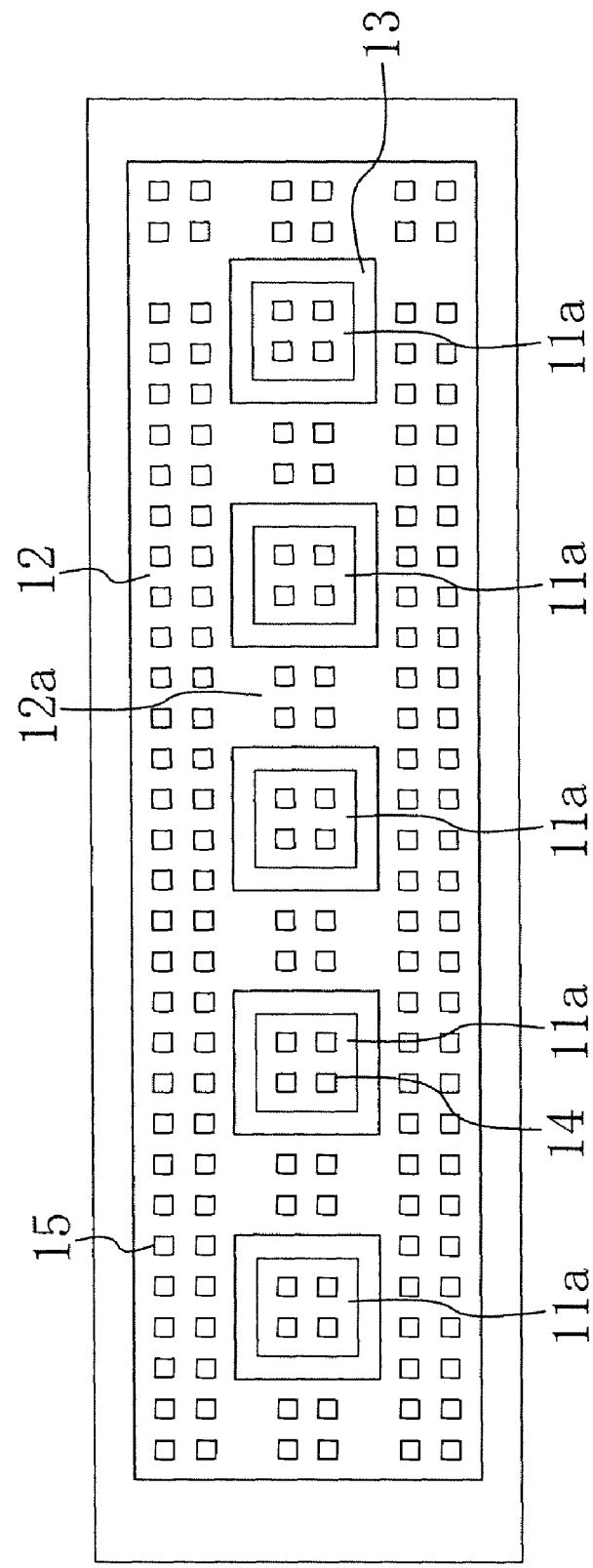
FIG. 6 is a plan view illustrating a configuration of an electrostatic discharge protection element of a semiconductor integrated circuit device of Embodiment 6 of the present invention.
Figure 8A:
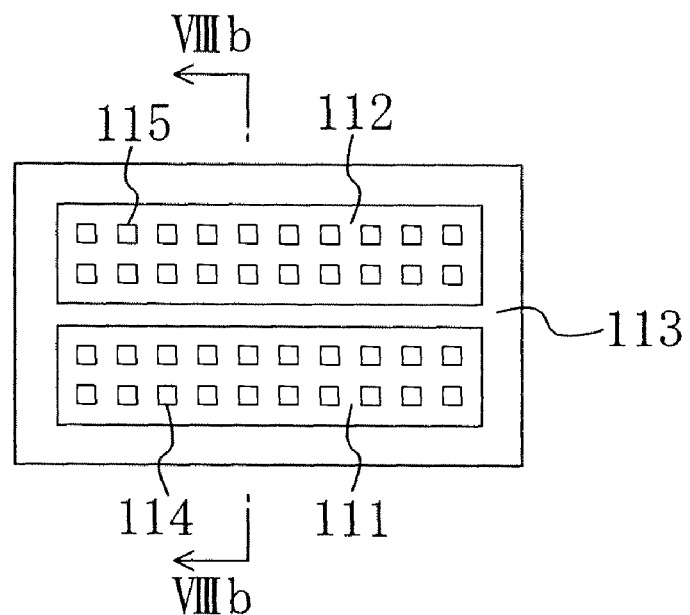
FIG. 8A is a plan view illustrating a configuration of a conventional electro static discharge protection element.
Figure 8B:
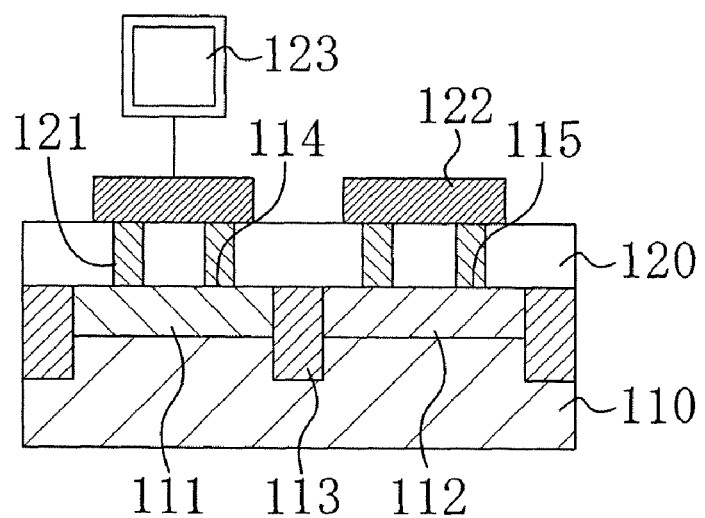
FIG. 8B is a cross section taken along the line VIIIb-VIIIb of FIG. 8A.

FIG. 6 is a plan view illustrating a configuration of an electro static discharge protection element of a semiconductor integrated circuit device of Embodiment 6 of the present invention and has such a configuration that the first diffusion layer 11 of the protection element of FIG. 1 is formed into a plurality of divided diffusion regions 11a. In this case, the second diffusion layer 12 is formed also in part 12a between the divided diffusion regions.

According to the configuration, it is possible to further increase the length along which each of the first diffusion layer 11a and the second diffusion layer 12 and 12a face each other. Therefore, it is possible to realize an electro static discharge protection element having further improved resistance to ESD and reduced input capacitance.

In Embodiment 6, various methods may be adopted to divide the first diffusion layer 11 into a plurality of diffusion regions 11a. The divided diffusion regions 11a may be square or rectangular in shape. Alternatively, the diffusion regions 11a may be polygonal as shown in FIG. 7. Moreover, the arrangement of the divided diffusion regions 11a is not limited to one line as shown in FIG. 6 and FIG. 7. The diffusion regions 11a may be arranged in several lines. Note that, it is preferable that the divided diffusion regions 11a are arranged at a regular interval to obtain a uniform path for the surge current.

The present invention has been described with reference to the preferred embodiments. However, these descriptions are not to limit the scope of the invention, and of course, various modifications are possible. For example, in the above-mentioned embodiments, the well region 10 is n type, the first diffusion layer 11 is p type, and the second diffusion layer 12 is n type. However, the opposed conductivity type may be used. Although the first diffusion layer 11 in embodiments is rectangular in shape, only both end portions along the long sides may have a greater area. Also in this case, it is possible to prevent the concentration of the surge current on the both end portions.

What is claimed is:
1. A semiconductor integrated circuit device comprising an electro static discharge protection element,
   the electro static discharge protection element being formed by a diode including:
   a well region of a first conductivity type in a semiconductor substrate; and
   a first diffusion layer of a second conductivity type in the well region, wherein the first diffusion layer is surrounded by a second diffusion layer of the first conductivity type in the well region, the first diffusion layer has a surface on which a first contact region connected to an input/output terminal is formed, and the second diffusion layer has a surface on which a second contact region connected to a reference voltage terminal is formed, the first diffusion layer has a rectangular shape whose sides are each formed linearly when viewed in plan, a dielectric isolation region is formed between the first diffusion layer and the second diffusion layer to surround an entire periphery of the first diffusion layer, and the second contact region is formed on portions of the second diffusion layer facing a long side and a short side of the first diffusion layer.

2. The semiconductor integrated circuit device of claim 1, wherein the first contact region formed along a longitudinal direction of the first diffusion layer has end portions which are greater in area than the other portions of the first contact region.

3. The semiconductor integrated circuit device of claim 1, wherein a width of the second diffusion layer facing a short side of the first diffusion layer is narrower than a width of the second diffusion layer facing a long side of the first diffusion layer.

4. The semiconductor integrated circuit device of claim 1, wherein a distance between the first diffusion layer and the second diffusion layer along a long side of the first diffusion layer is narrower than a distance between the first diffusion layer and the second diffusion layer along a short side of the first diffusion layer.

5. The semiconductor integrated circuit device of claim 1, wherein the first diffusion layer is formed into a plurality of divided diffusion regions, and the second diffusion layer is formed also between the divided diffusion regions.

6. The semiconductor integrated circuit device of claim 5, wherein the divided diffusion regions are arranged at a regular interval.

7. The semiconductor integrated circuit device of claim 1, wherein the first contact region and the second contact region are respectively formed into a plurality of divided contact regions.

8. The semiconductor integrated circuit device of claim 1, wherein the first conductivity type is an n-type and the second conductivity type is a p-type.

9. The semiconductor integrated circuit device of claim 1, wherein the dielectric isolation region is deeper than the first diffusion layer and the second diffusion layer.

10. The semiconductor integrated circuit device of claim 1, wherein the first contact region is connected to the input/output terminal via a first contact plug formed in an interlayer dielectric film on the semiconductor substrate, and the second contact region is connected to the reference voltage terminal via a second contact plug formed in the interlayer dielectric film on the semiconductor substrate.

11. The semiconductor integrated circuit device of claim 1, wherein the input/output terminal is a pad for external connection, and the reference voltage terminal is a power supply terminal or a ground terminal.

12. The semiconductor integrated circuit device of claim 1, wherein the sides of the rectangular first diffusion layer and portions of the second diffusion layer which respectively face the sides of the rectangular first diffusion layer with the dielectric isolation region interposed therebetween linearly extend parallel to each other.

* * * * *